US008800907B2

(12) United States Patent
Koenig et al.

(10) Patent No.: US 8,800,907 B2
(45) Date of Patent: Aug. 12, 2014

(54) MOBILE DEVICE CASE WITH RETRACTOR REEL ASSEMBLY FOR USER-PROVIDED HEADPHONES

(75) Inventors: Scott Koenig, Brooklyn, NY (US); David Conroy, Brooklyn, NY (US)

(73) Assignee: Scott Koenig, Brooklyn, NY (US)

( * ) Notice: Subject to any disclaimer, the term of this patent is extended or adjusted under 35 U.S.C. 154(b) by 316 days.

(21) Appl. No.: 13/251,317

(22) Filed: Oct. 3, 2011

(65) Prior Publication Data

US 2013/0083456 A1 Apr. 4, 2013

(51) Int. Cl.
*B65H 75/48* (2006.01)

(52) U.S. Cl.
USPC ........ 242/379; 242/370; 242/375; 242/385.1; 381/370; 381/384; 361/679.01; 361/755; 455/575.1; 191/12.4

(58) Field of Classification Search
USPC .............. 242/370, 375, 379, 385.1; 381/384; 381/370; 361/679.01, 755; 455/575.1; 191/12.4
See application file for complete search history.

(56) References Cited

U.S. PATENT DOCUMENTS

| 3,346,705 | A | * | 10/1967 | Slinkard | 191/12.4 |
| 3,657,491 | A | * | 4/1972 | Ryder et al. | 191/12.2 R |
| 4,942,617 | A | | 7/1990 | Boylan | |
| 5,339,461 | A | | 8/1994 | Luplow | |
| 6,179,238 | B1 | | 1/2001 | Phillipps | |
| 6,416,005 | B1 | * | 7/2002 | Liao | 242/378.1 |
| 6,433,274 | B1 | * | 8/2002 | Doss et al. | 174/50 |
| 6,434,249 | B1 | | 8/2002 | Wei | |
| 6,502,777 | B2 | * | 1/2003 | Liao | 242/373 |
| 6,542,757 | B2 | * | 4/2003 | Bae | 455/575.2 |
| 6,578,683 | B1 | | 6/2003 | Burke | |
| 6,658,130 | B2 | * | 12/2003 | Huang | 381/384 |
| 6,712,304 | B1 | | 3/2004 | Taylor | |

(Continued)

FOREIGN PATENT DOCUMENTS

| KR | 200214556 | 2/2001 |
| KR | 200423708 | 8/2006 |

(Continued)

OTHER PUBLICATIONS

Koenig, Scott et al., International Search Report & Written Opinion dated Mar. 27, 2013, PCT/US2012/056970, International Filing Date Sep. 24, 2012.

(Continued)

*Primary Examiner* — Hung S Bui
*Assistant Examiner* — James Wu
(74) *Attorney, Agent, or Firm* — North Shore Patents, P.C.; Michele Liu Baillie (57) ABSTRACT

A mobile device case includes a reel assembly, including a reel, a supporting plate, and a hub between the reel and the supporting plate. The hub includes a first cavity between the hub and the supporting plate for housing a spring, and a second cavity between the hub and the reel for housing a flat flexible cable (FFC). The spring is wound in a first direction, while the FFC is wound in a second direction. The FFC includes a first end for electrically coupling to a female jack connector of a device. A female connector is electrically coupled to a second end of the FFC for engaging a male jack connector of user-provided headphones. When the reel rotates in the first direction, the spring tightens and the FFC loosens. When the reel rotates in the second direction, the spring loosens and the FFC tightens.

15 Claims, 7 Drawing Sheets

(56) References Cited

U.S. PATENT DOCUMENTS

| | | | |
|---|---|---|---|
| 6,834,820 B2 * | 12/2004 | Wei | 242/378 |
| 7,077,693 B1 | 7/2006 | Symons | |
| 7,308,109 B2 * | 12/2007 | Jeong et al. | 381/384 |
| 7,599,509 B2 | 10/2009 | Ito | |
| 7,825,334 B2 * | 11/2010 | Chien | 174/50 |
| 2001/0035242 A1 * | 11/2001 | Hughs et al. | 150/154 |
| 2002/0023814 A1 * | 2/2002 | Poutiatine | 191/12.2 R |
| 2003/0068061 A1 * | 4/2003 | Huang | 381/384 |
| 2003/0157973 A1 | 8/2003 | Yang | |
| 2004/0256188 A1 * | 12/2004 | Harcourt | 191/12.2 A |
| 2005/0109869 A1 * | 5/2005 | Wei | 242/370 |
| 2005/0236243 A1 * | 10/2005 | Huang | 191/12.4 |
| 2005/0255898 A1 | 11/2005 | Huang | |
| 2008/0080732 A1 * | 4/2008 | Sneed | 381/374 |
| 2008/0111014 A1 * | 5/2008 | Wu | 242/397 |
| 2008/0119952 A1 * | 5/2008 | Smith et al. | 700/90 |
| 2011/0233078 A1 * | 9/2011 | Monaco et al. | 206/223 |
| 2012/0320546 A1 * | 12/2012 | Wu | 361/755 |

FOREIGN PATENT DOCUMENTS

| | | |
|---|---|---|
| KR | 100643119 | 11/2006 |
| WO | 02/060801 | 8/2002 |
| WO | 03/086929 | 10/2003 |

OTHER PUBLICATIONS

Be a Headcase, "HeadCase Retractable HeadPhone Case", date unknown, all pages, https://beaheadcase.com/index.php/shop/retractable-headphone-cases/retractable-headphone-case-by-be-a-headcase-15/.

* cited by examiner

MOBILE DEVICE CASE WITH RETRACTOR REEL ASSEMBLY FOR USER-PROVIDED HEADPHONES

BACKGROUND OF THE INVENTION

Cases and headphones are commonly used with mobile devices, such as mobile phones and music players. However, in using the headphones with the mobile device, the headphones cords are often loose. Connecting and disconnecting the headphones with the mobile device requires two hands, one to hold the device and the other to manage the headphones. Further, when the headphones are not in use, a user typically winds the cords around the mobile device, an activity that also requires two hands. When the headphones can be stored in a carrying case, the carrying case is often separate from mobile device, requiring the user to remove the headphones from the mobile device and insert the headphones into the carrying case. Although mobile device cases with attached headphones carrying cases exist, they either come with headphones permanently attached to the carrying case, where if the headphones break, a whole new case needs to be purchased, or they still require two hands to plug/unplug the headphone into/from the mobile device.

BRIEF SUMMARY OF THE INVENTION

According to one embodiment of the present invention, a mobile device case comprises a reel assembly, wherein the reel assembly comprises: a reel for storing a cord of user-provided headphones; a supporting plate coupled to the reel; a hub coupled between the reel and the supporting plate, comprising: a first cavity between a first side of the hub and the supporting plate, and a second cavity between a second side of the hub and the reel; a spring residing within the first cavity of the hub, wherein the spring is wound around a center of the hub in a first direction; a flat flexible cable (FFC) residing within the second cavity of the hub, wherein the FFC is wound around the center of the hub in a second direction opposite to the first direction, the FFC comprising a first end for electrically coupling to a female jack connector of a device; and a female connector electrically coupled to a second end of the FFC for engaging a male jack connector of the user-provided headphones, wherein when the reel rotates in the first direction, the winding of the spring tightens and the winding of the FFC loosens, wherein when the reel rotates in the second direction, the winding of the spring loosens and the winding of the FFC tightens.

In another aspect of the present invention, the supporting plate comprises a plurality of pegs, wherein the hub further comprises a plurality of holes corresponding to the plurality of pegs and a first center hole, wherein the plurality of pegs of the supporting plate residing within the plurality of holes of the hub prevents the hub from rotating when the reel rotates in the first direction or the second direction.

In another aspect of the present invention, the supporting plate comprises an axel, the hub further comprises a first center hole, and the reel comprises a second center hole, wherein the axel of the supporting plate traverses the first center hole of the hub and the second center hole of the reel, wherein the axel couples to the reel in the second center hole of the reel.

In another aspect of the present invention, the reel comprises a center post, wherein the hub comprises an outer side wall, wherein the spring comprises a first end and a second end, wherein the first end of the spring couples to the center post of the reel, wherein the second end of the spring couples to the outer side wall of the hub.

In another aspect of the present invention, the case further comprises a membrane, the membrane comprising a first surface and a second surface opposite to the first surface, wherein the second end of the FFC is electrically coupled to the first surface of the membrane, wherein the female connector is mounted and electrically coupled to the second surface of the membrane.

In another aspect of the present invention, the female connector resides on a surface of the reel opposite to the hub, wherein when the reel rotates in the first direction, the female connector rotates in the first direction, wherein when the reel rotates in the second direction, the female connector rotates in the second direction.

In another aspect of the present invention, the case further comprises a headphone switch assembly, comprising: a male jack connector electrically coupled to the second end of the FFC; and a switch mechanism for engaging and disengaging the male jack connector with the female jack connector of the device.

In another aspect of the present invention, the reel further comprises a plurality of notches, wherein the case further comprises a retractor switch assembly, comprising: an arm, a cavity proximate to the arm, and a switch mechanism for moving the arm into or out of the cavity, wherein when the arm moves into the cavity, the arm disengages from any of the plurality of notches, wherein when arm moves out of cavity, the arm engage any of the plurality of notches.

In another aspect of the present invention, the case further comprises a reel cover coupled to the reel at a side opposite to the hub.

In another aspect of the present invention, the case further comprises: a main body coupled to the reel assembly at a first side of the main body, the main body comprising a main body cavity at a second side of the main body for housing the device; a shell coupled to the main body, wherein the reel assembly resides between the main body and the shell; and an end cap for coupling to the main body to hold the device within the main body cavity.

In another aspect of the present invention, the supporting plate of the reel assembly is integrated with the first side of the main body.

DETAILED DESCRIPTION OF THE INVENTION

The following description is presented to enable one of ordinary skill in the art to make and use the invention and is provided in the context of a patent application and its requirements. Various modifications to the embodiment will be readily apparent to those skilled in the art and the generic principles herein may be applied to other embodiments. Thus, the present invention is not intended to be limited to the embodiment shown but is to be accorded the widest scope consistent with the principles and features described herein.

An embodiment of the present invention provides a mobile device case with a retractor reel assembly for accommodating user-provided headphones. In this embodiment, the mobile device case comprises features for storing the headphones, extending the headphone cord from the retractor reel assembly for use, and electrically coupling the male jack connector of the user-provided headphones to the female jack connector of the mobile device through a switch. The embodiment of the mobile device case further comprises features for electrically decoupling the male jack connector of the user-provided headphones from the female jack connector of the mobile device through a switch, retracting the cord of the headphones into the retractor reel assembly, and storing the headphones in a secure and convenient manner for future use.

Figure 1:
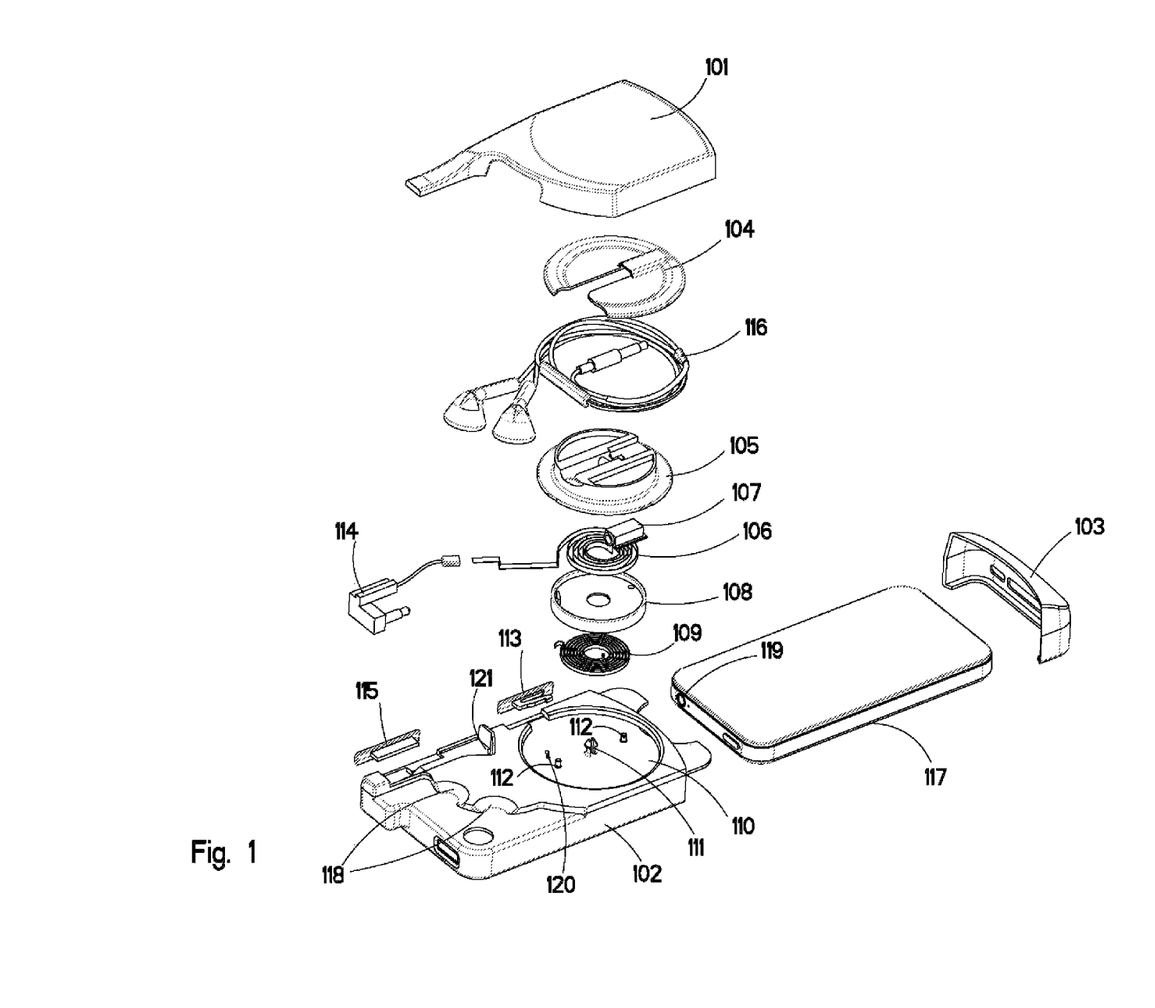
FIG. 1 illustrates an exploded view of a mobile device case with retractor reel assembly according to an embodiment of the present invention.

FIG. 1 illustrates an exploded view of a mobile device case with retractor reel assembly according to an embodiment of the present invention. The mobile device case 100 comprises a shell 101, a main body 102, and an end cap 103. A mobile device, such as a mobile phone 117, may be inserted into the main body 102. The end cap 103 may then be engaged with the main body 102 to hold the phone 117 within the main body 102. Other manners of holding the phone 117 within the main body 102 may be used without departing from the spirit and scope of the present invention.

A reel assembly resides between the shell 101 and the main body 102. The reel assembly comprises a reel cover 104, a reel 105, and a hub 108. The hub 108 is coupled to and between a supporting plate 110 and the reel 105. In this embodiment, the supporting plate 110 is integrated with a device-specific main body 102 to form a reel supporting recess. The supporting plate 110 comprises an axel 111 and a plurality of pegs 112. The hub 108 comprises holes corresponding to the pegs 112, such that when the pegs 112 reside within the holes in the hub 108, the hub 108 cannot rotate. The hub 108 comprises two compartments: a first compartment between the supporting plate 110 and the hub 108 to house a spring 109; and a second compartment between the hub 108 and the reel 105 to house a flat flexible cable (FFC) 106. Use of the FFC 106 saves space and allows for smooth, uninhibited rotation of the retractor reel assembly. The reel 105 comprises a center hole, through which the axel 111 of the supporting plate 110 may traverse and engage the reel 105. The hub 108 also comprises a center hole around which the FFC 106 and the spring 109 winds. When the axel 111 engages the reel 105, the FFC 106, the hub 108, and a first end of the spring 109 are held in place. Coupled to the FCC 106 is a female connector 107 to which the male jack connector of user-provided headphones 116 may couple. The female connector 107 is shown in FIG. 1 under the reel 105 to illustrate its mounting to the FFC 106. However, when assembled, the female connector 107 resides above the reel 105. The reel 105 is coupled to the reel cover 104 through friction fitting mechanism, adhesive, or some other similar coupling means. One end of the FFC 106 extends beyond the reel assembly to electrically couple to a male connector assembly 114 of the case 100. The male connector assembly 114 couples to a headphone switch assembly 115 for controlling the engagement and disengagement of the male connector assembly 114 with the female jack connector 119 of the mobile device. The headphone switch assembly 115 allows a user to plug and unplug the headphones 116 from the phone 117 using one hand.

When stored, the cord of the user-provided headphones 116 winds around the center of the reel 105 and is held in place with assistance from the reel cover 104. When the cord of the headphones 116 is extended by pulling on the cord, the reel cover 104, the reel 105, the FCC 106, the female connector 107, and the spring 109 rotate in one direction. In this direction, the winding of the spring 109 is tightened while the winding of the FFC 106 is loosened. The extended cord is held in place by the retractor reel switch 113 engaging one of a plurality of notches on the reel 105. To retract the cord, the retractor switch assembly 113 is disengaged from the notches of the reel 105, allowing the winding of the spring 109 to loosen, rotating the reel cover 104, the reel 105, the FFC 106, and female connector 107 in the opposite direction. When fully retracted, the ear buds of the headphones 116 may rest within cavities 118 of the main body 102. The extension and retraction features of the retractor reel assembly are further described below.

Figures 2A, 2B, 2C:
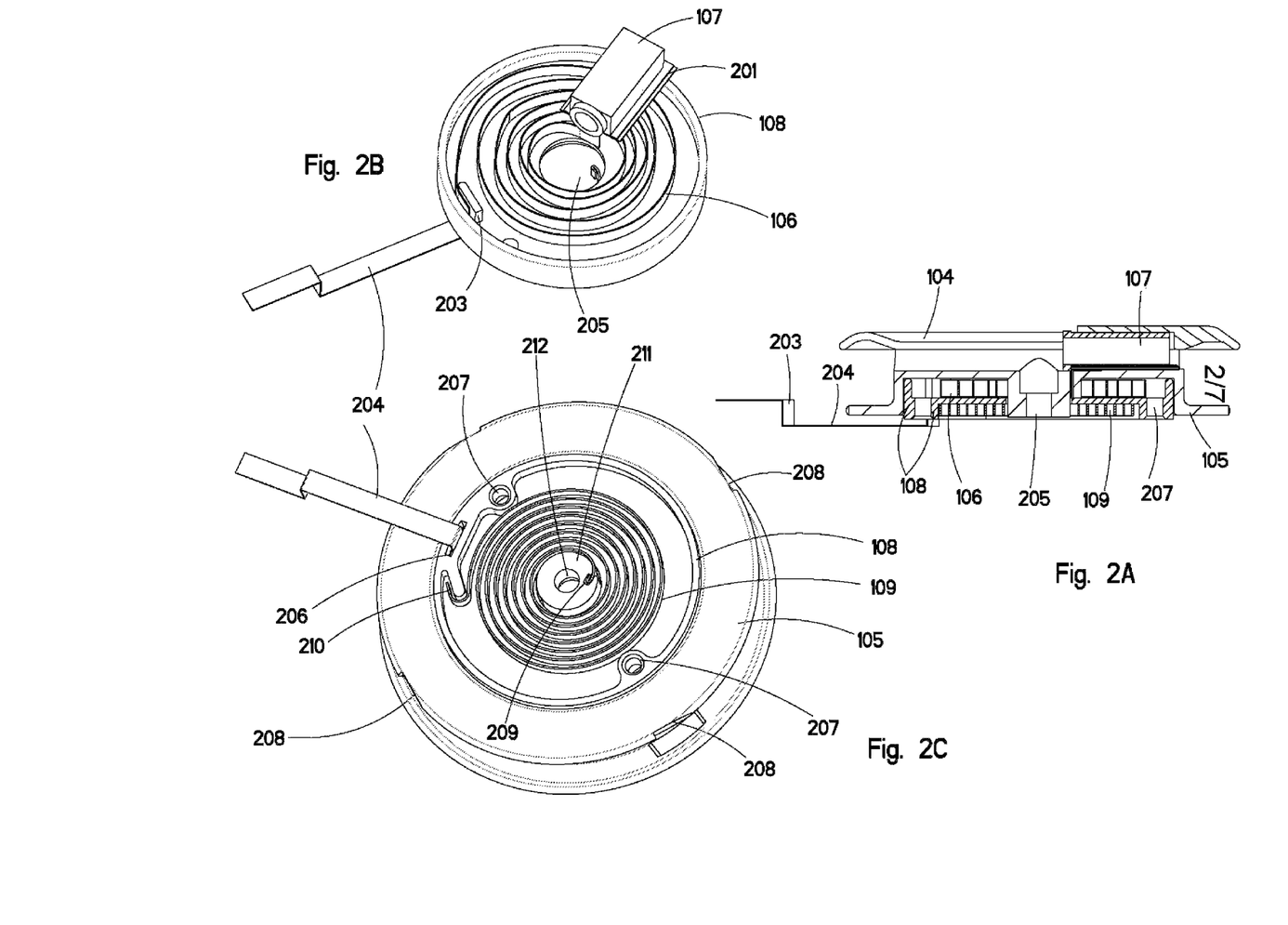
FIGS. 2A-2C illustrate in more detail the retractor reel assembly according to the embodiment of the present invention.

FIGS. 2A-2C illustrate in more detail the retractor reel assembly according to the embodiment of the present invention. FIG. 2A illustrates a cross-sectional view of the retractor reel assembly. FIG. 2B illustrates a perspective view of the FFC cavity of the hub 108. FIG. 2C illustrates a perspective view of the spring cavity of the hub 108. Referring to FIGS. 2A-2C in conjunction with FIG. 1, the hub 108 comprises holes 207 corresponding to the pegs 112 of the supporting plate 110. The hub 108 couples to the supporting plate 110, forming a first cavity (spring cavity) between the supporting plate 110 and one side of the hub 108, within which resides the spring 109 (see FIG. 2C). The hub 108 further comprises a center hole 205 through which the axel 111 may traverse. The reel 105 is coupled to the supporting plate 110 by the axel 111 traversing its center hole 212, forming a second cavity (FFC cavity) between the reel 105 and another side of the hub 108, within which the FFC 106 resides (see FIG. 2B). The spring 109 is wound around the center hole 205 of the hub 108 in a first direction. The FFC 106 is wound around the center hole 205 of the hub 108 in a second direction opposite to the first direction. The reel 105 comprises a center post 211 residing within the center hole 205 of the hub 108. The inner end 209 of the spring 109 is coupled to the center post 211 of the reel 105, allowing the spring 109 to rotate with the reel 105 (see FIG. 2C). The outer end 210 of the spring 109 is coupled to an outer side wall of the hub 108, which does not rotate. When the axel 111 engages the reel 105, the hub 108, the spring 109, and the FFC 106 are held together. The reel 105 comprises notches 208 for engaging the retractor switch assembly 113, as described further below.

The female connector 107 is surface-mounted to a surface of a membrane 201 comprised at one end of the FFC 106. The membrane 201 provides the electrical connection between the female connector 107 and the FFC 106. The FFC 106 allows the female connector 107 to be electrically coupled using surface-mounting technology, reducing bulk and allowing for cost savings in manufacturing. In this embodiment, during manufacturing of the reel assembly, the female connector 107 is mounted to the membrane 201 before the reel 105 is coupled to the supporting plate 110. The female connector 107 and the membrane 201 are then placed on the surface of the reel 105 opposite to the hub 108 in any of a number of ways. The reel cover 104 is then coupled to the reel 105.

The end of the FFC 204 opposite the membrane 201 extends beyond the reel assembly (see FIG. 2B). In this embodiment, the end of the FFC 204 traverses through the hub 108 via an opening 206 (see FIG. 2C) from the FFC cavity to the spring cavity and then through a corresponding opening 120 (see FIG. 1) in the supporting plate 110. Proximate to the location where the FFC 106 traverses through the hub 108, the FFC 106 is coupled to a supporting wall 203 to prevent the FFC 106 within the FFC cavity from being pulled out of the FFC cavity. The end of the FFC 204 travels along the main body 102 on the side opposite to the reel assembly to another opening 121 (see FIG. 1). The FFC 106 traverses the main body 102 through the opening 121 and couples to the male connector assembly 114. The traversing of the FFC 106 in this manner ensures that the FFC 106 resides outside the path of wires or cords and away from the rotating portions of the reel assembly. Unwanted interference from or abrasions to the FFC 106 are reduced or eliminated. Other paths for the FFC 106 to travel between the reel assembly and the male connector assembly 114 may be chosen for the same purpose without departing from the spirit and scope of the present invention.

Figure 3A:
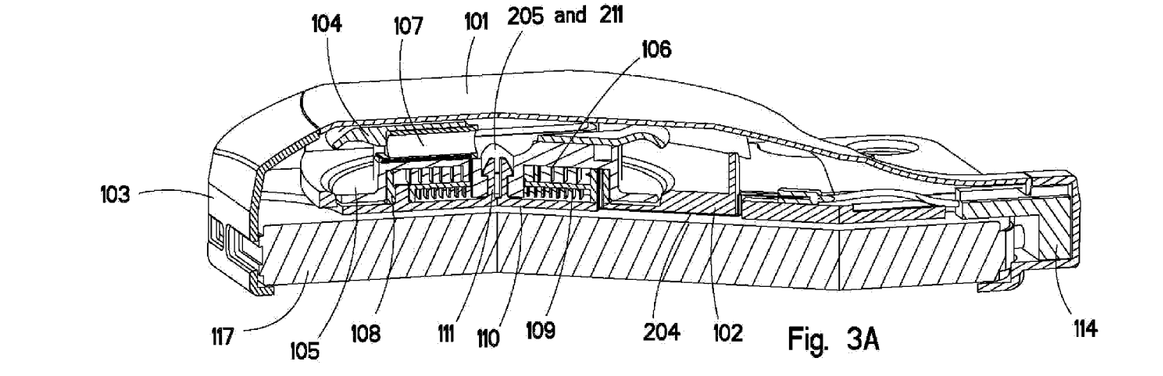
FIGS. 3A-3D illustrate cut away and cross-sectional views of the mobile case with retractor reel assembly according to the embodiment of the present invention.
Figure 3B:
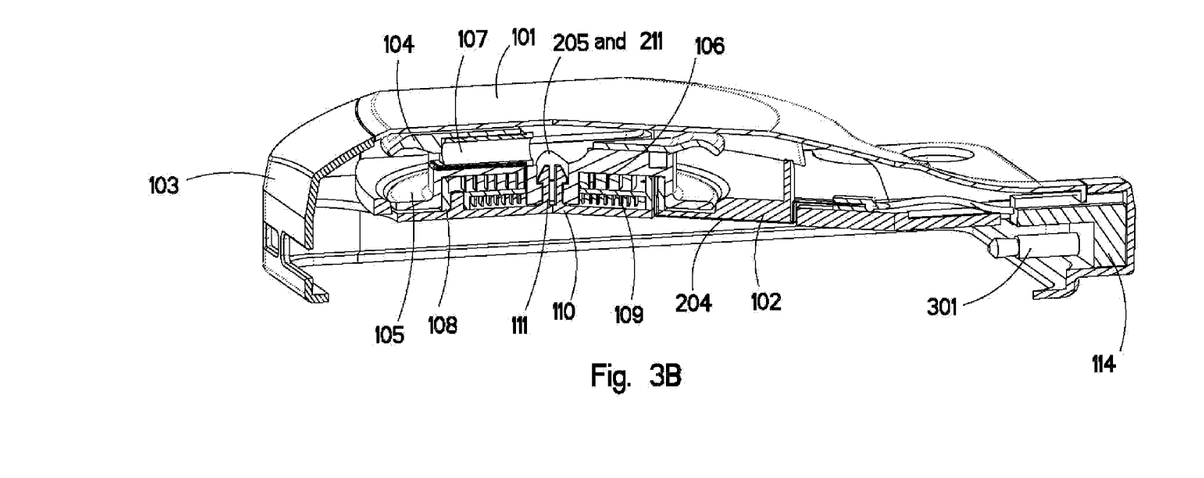
Figure 3C:
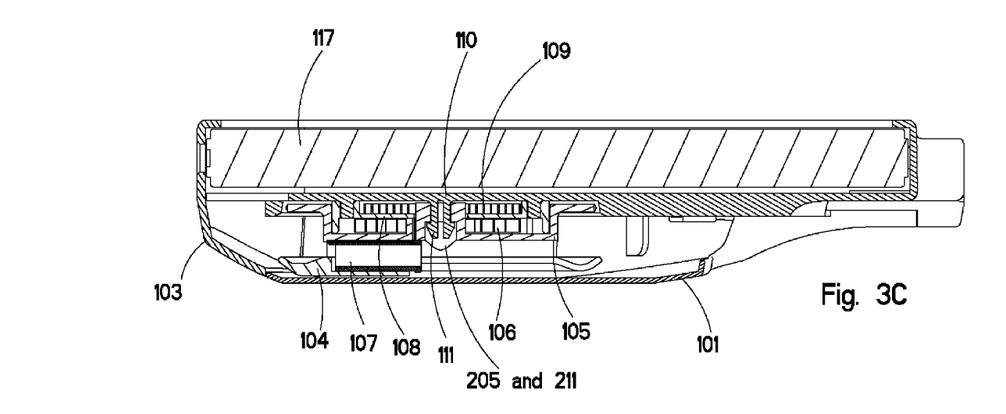
Figure 3D:
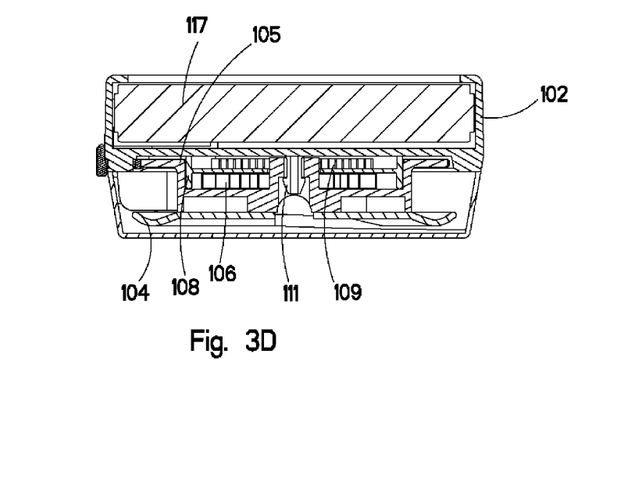

FIGS. 3A-3D illustrate cut away and cross-sectional views of the mobile case with retractor reel assembly according to the embodiment of the present invention. FIG. 3A illustrates a cut away view of the mobile case 100 with the phone 117. FIG. 3B illustrates a cut away view of the mobile case 100 without the phone 117. FIG. 3C illustrates a length-wise cross-sectional view of the mobile case 100 with the phone 117. FIG. 3D illustrates a width-wise cross-sectional view of the mobile case 100 with the phone 117. In FIGS. 3A-3D, the reel assembly is illustrated as it resides between the shell 101 and the main body 102. The axel 111 traverses the holes 205 and 211 of the hub 108 and the reel 105. Here, the axel 111 comprises prongs that engage the reel 105 as illustrated. The end of the FFC 204 extends beyond the reel assembly to couple to the male connector assembly 114 (see FIGS. 3A-3B). The male connector assembly 114 comprises a male jack connector 301 (see FIG. 3B), which is capable of engaging with the female jack connector 119 on the phone 117.

Figure 4:
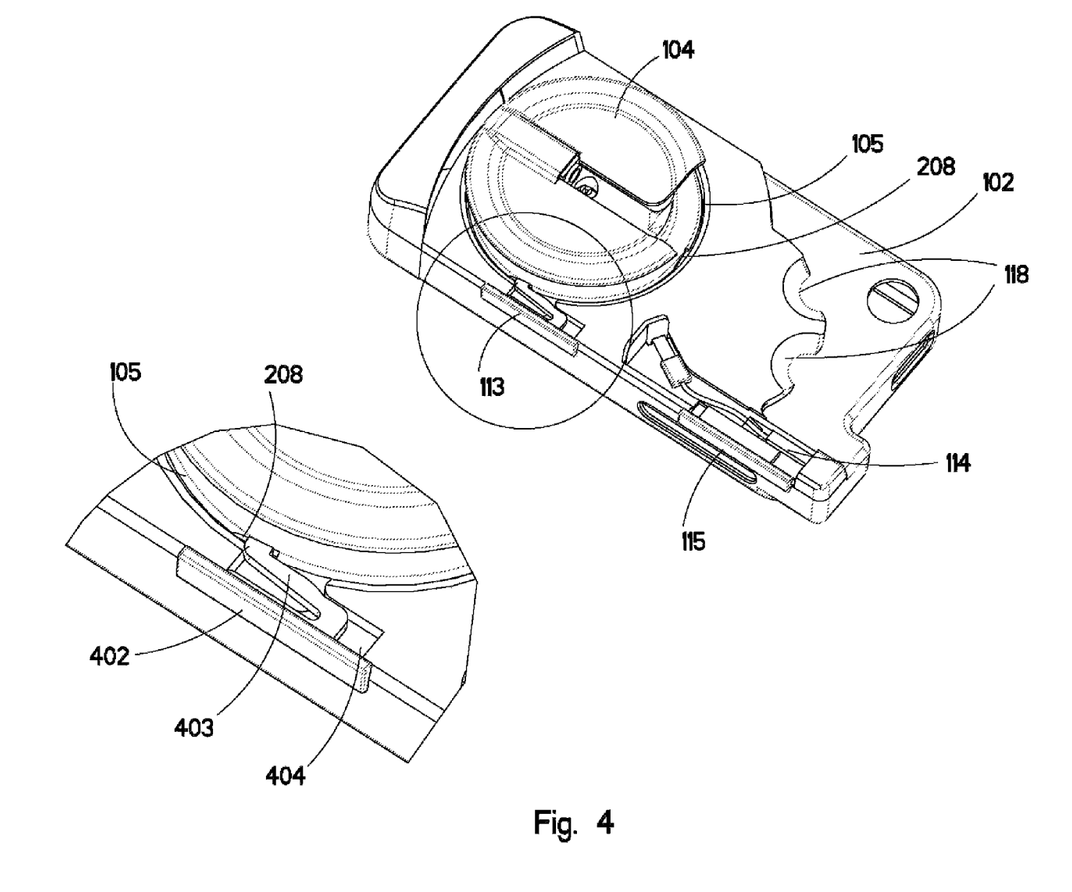
FIG. 4 illustrates in more details the switch assemblies according to the embodiment of the present invention.

FIG. 4 illustrates in more details the switch assemblies according to the embodiment of the present invention. Here, the case 100 is illustrated without the shell 101 and includes a detailed view of the retractor switch assembly 113. The headphones switch assembly 115 slides along the side of the case 101 to move the male connector assembly 114. With this embodiment, a user slides the headphone switch assembly 115 toward the reel assembly to electrically connect the male jack connector 301 to the female jack connector on the phone 117. This completes the electrical connection between the headphones 116 coupled to the female connector 107 of the reel assembly and the female jack connector 119 of the phone via the membrane 201 and the FFC 106. A user may disengage the headphones 116 at any time by sliding the headphone switch assembly 115 in the opposite direction with one hand.

The retractor switch assembly 113 comprises a slider 402 for moving an arm 403 along a cavity 404 in the main body 102. The arm 403 is able to engage and disengage from any of the notches 208 on the reel 105. To use the headphones 116, the user removes the ear buds from the cavities 118 and extends the cord of the headphones 116 by pulling. The extension of the headphones cord rotates the reel assembly (except for the hub 108) in a certain direction, tightening the spring 109 and loosening the FFC 106. Enough length of the FFC 106 winds around the center of the hub 108 to accommodate the extension of a cord length that may fit within the reel assembly. When the user stops extending the headphones cord, the end of the arm 403 engages or catches one of the notches 208 of the reel 105. The catching of the notch 208 prevents the spring 109 from loosening, thus holding the reel assembly stationery and the cord at the desired length.

To retract the headphones cord, the user moves the slider 402 of the retractor switch assembly 113 to cause the arm 403 to move into the cavity 404. The movement of the arm 403 into the cavity 404 causes the arm 403 to disengage from the notch 208 of the reel 105. The disengagement of the arm 403 from the notch 208 allows the spring 109 to naturally unwind or loosen, causing the reel assembly (except for the hub 108) to rotate in the opposite direction, winding the headphones cord around the reel 105. The user may move the slider 402 again to engage the arm 403 with another notch 208 of the reel 105 to hold the headphones cord at the desired shorter length or allow the cord to fully retract. When fully retracted, the ear buds may be stored back in the cavities 118.

In this embodiment, when the spring 109 is at a neutral state, i.e., at its most relaxed position, the FFC 106 is wound several times around the center of the hub 108 without tension. When the reel assembly rotates during the extension of the headphones cord, the FFC 106 loosens or unwinds further. When the FFC 106 is fully unwound, if the reel assembly continues to rotate without changing directions, the FFC 106 turns at the center of the hub 108 and begins to wind in the opposite direction, tightening the FFC 106. In this manner, a shorter-length FFC 106 may be used to support a longer-length headphones cord, saving space. The rotation of the reel assembly to extend the headphones cord is limited according to the tension of the spring 109. The length of the FFC 106 may be such that, regardless of the turning of the reel 105, the FFC 106 remains without tension.

To replace the headphones 116, the user removes the shell 101, unwinds the headphones cord from the reel 105 without rotating the reel assembly, and disconnects the male jack connector of the headphones 116 from the female connector 107 of the reel assembly. A different pair of headphones may then be inserted by connecting the male jack connector of the replacement headphones into the female connector 107, manually winding the replacement headphones cord around the reel 105 in the same direction as the winding of the FFC 106, without rotating the reel assembly, and returning the shell 101 to its place. In this embodiment, when the cord in its fully retracted position, the spring 109 is at a neutral state.

Although the switch assemblies 113 and 115 are described above as sliders, other switch mechanisms may be used without departing from the spirit and scope of the present invention.

Figure 5A:
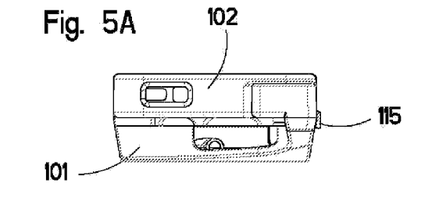
FIGS. 5A-5E illustrate various views of an assembled mobile case with retractor reel assembly according to the embodiment of the present invention.
Figure 5B:
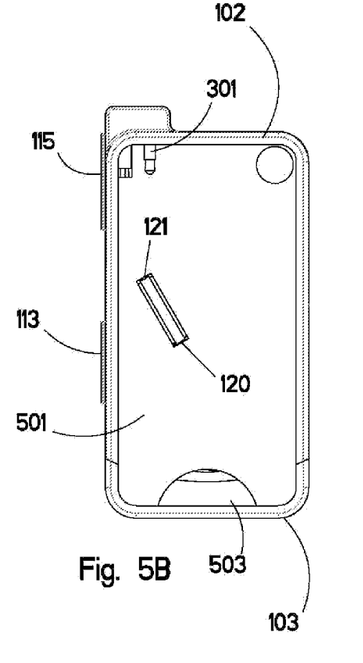
Figures 5C, 5D:
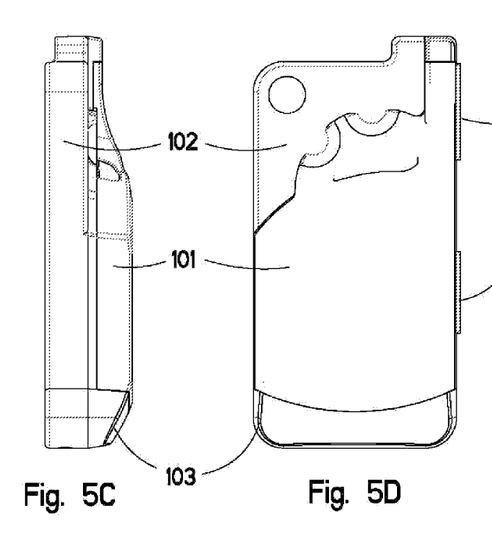
Figure 5E:
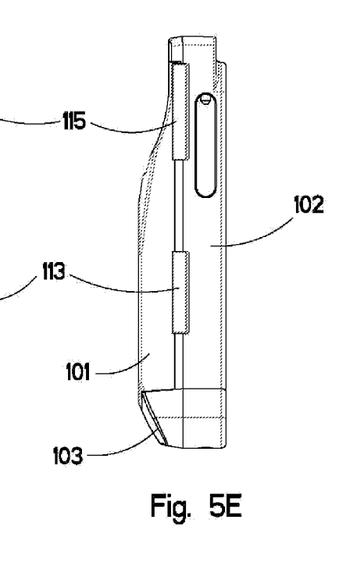

FIGS. 5A-5E illustrate various views of an assembled mobile case with retractor reel assembly according to the embodiment of the present invention. FIG. 5A illustrates a top end view of the assembled case 100. FIGS. 5B and 5C illustrate a front view and a right side view, respectively, of the assembled case 100. FIGS. 5D and 5E illustrate a back view and a left side view, respectively, of the assembled case 100. In FIG. 5B, the assembled case 100 is illustrated without the phone 117 and but as if the face of the phone 117 is facing forward. The main body 102 comprises a main body cavity 501 within which the phone 117 would reside. The main body cavity 501 comprises the opening 120 and 121, described above. Here, the FCC 106 traverses into the main body cavity 501 through the opening 120, travels within the main body cavity 501, and traverses out of the main body cavity 501 through the other opening 121 to couple with the male connector assembly 114. The main body 102 further comprises a cut out 503 to assist in removing a phone from the main body cavity 501.

Figures 6A, 6B:
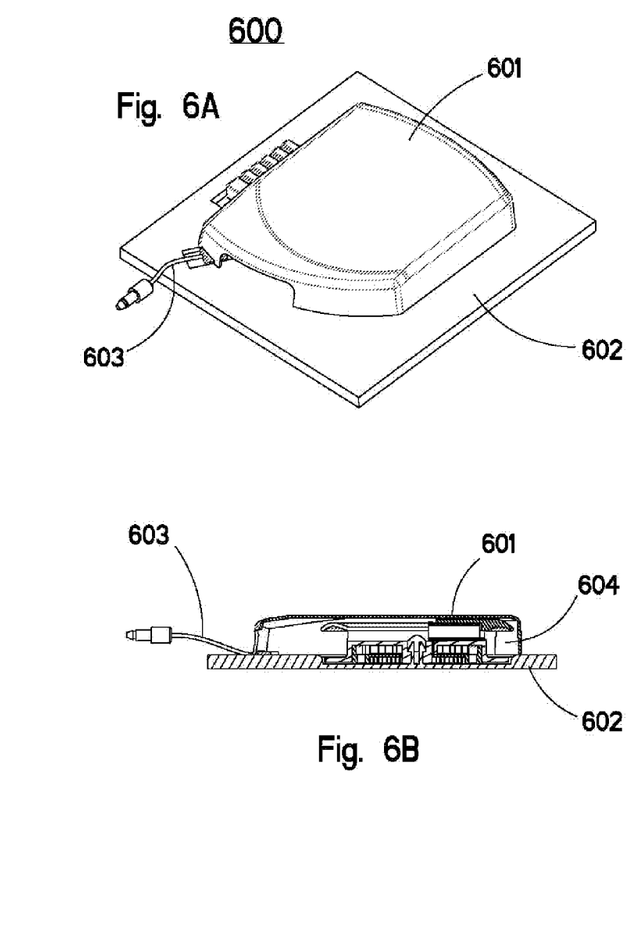
FIGS. 6A and 6B illustrate a perspective view and a cross-sectional view, respectively, of a first alternative embodiment of the mobile case with retractor reel assembly according to the present invention.

FIGS. 6A and 6B illustrate a perspective view and a cross-sectional view, respectively, of a first alternative embodiment of the mobile case with retractor reel assembly according to the present invention. The case 600 comprises a shell 601, a supporting plate 602, a male connector 603, and a retractor reel assembly 604. In this embodiment, the retractor reel assembly 604 comprises the same components as described above in FIGS. 2A-2C. However, the supporting plate 602 is integrated with an exterior wall of a device. The case 600 may be integrated with a case for various types of devices, including non-mobile devices, cordless telephones, boom boxes, etc. When integrated, the male connector 603 may be coupled to a male connector assembly, such as assembly 114, or directly to a female connector of the device.

Figure 7A:
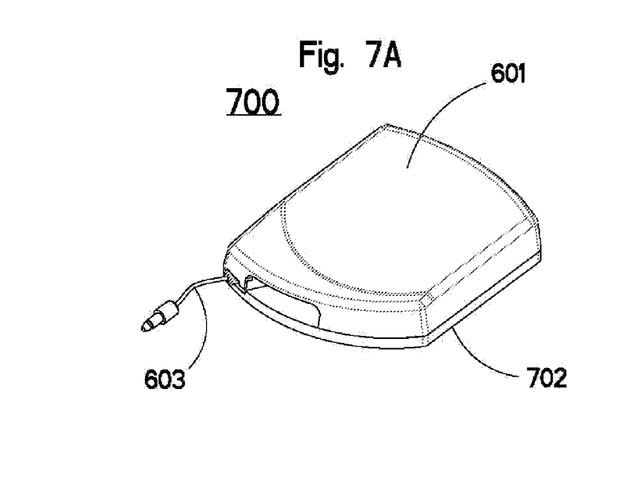
FIGS. 7A and 7B illustrate a perspective view and a cross-sectional view, respectively, of a second alternative embodiment of the mobile case with retractor reel assembly according to the present invention.
Figure 7B:
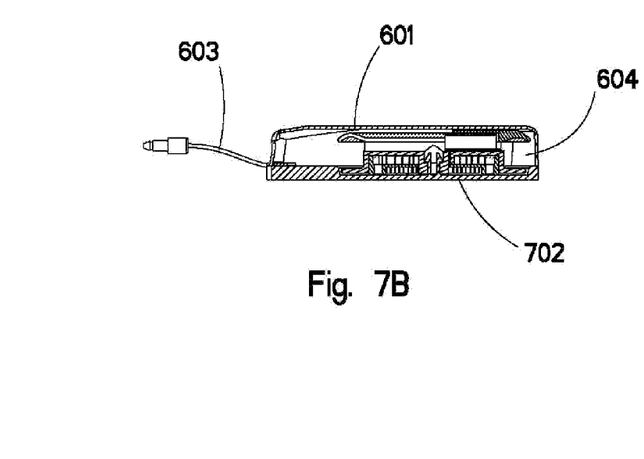

FIGS. 7A and 7B illustrate a perspective view and a cross-sectional view, respectively, of a second alternative embodiment of the mobile case with retractor reel assembly according to the present invention. Similar to case 600, the case 700 also comprises the shell 601, the male connector 603, and the reel assembly 604. In this embodiment, the supporting plate 702 is a stand-alone component. Here, the shape of the supporting plate 702 matches the shape of the shell 601 to form a compact self-contained retractor reel assembly case. This embodiment allows the case 700 to be manufactured as an independent component.

Although both cases 600 and 700 are illustrated with connector 603, the FFC of the reel assembly 604 may also extend beyond the case 600 or 700 without the connector 603 to allow for other forms of electrical coupling.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A mobile device case, comprising:
a reel assembly, comprising:
  a reel for storing a cord of user-provided headphones;
  a supporting plate coupled to the reel;
  a hub coupled between the reel and the supporting plate, comprising: a first cavity between a first side of the hub and the supporting plate, and a second cavity between a second side of the hub and the reel;
  a spring residing within the first cavity of the hub, wherein the spring is wound around a center of the hub in a first direction;
  a flat flexible cable (FFC) residing within the second cavity of the hub, wherein the FFC is wound around the center of the hub in a second direction opposite to the first direction, the FFC comprising a first end for electrically coupling to a female jack connector of a device; and
  a female connector electrically coupled to a second end of the FFC for engaging a male jack connector of the user-provided headphones,
  wherein when the reel rotates in the first direction, the winding of the spring tightens and the winding of the FFC loosens,
  wherein when the reel rotates in the second direction, the winding of the spring loosens and the winding of the FFC tightens; and
a membrane, the membrane comprising a first surface and a second surface opposite to the first surface,
  wherein the second end of the FFC is electrically coupled to the first surface of the membrane,
  wherein the female connector is mounted and electrically coupled to the second surface of the membrane.

2. A mobile device case, comprising:
a reel assembly, comprising:
  a reel for storing a cord of user-provided headphones;
  a supporting plate coupled to the reel;
  a hub coupled between the reel and the supporting plate, comprising: a first cavity between a first side of the hub and the supporting plate, and a second cavity between a second side of the hub and the reel;
  a spring residing within the first cavity of the hub, wherein the spring is wound around a center of the hub in a first direction;
  a flat flexible cable (FFC) residing within the second cavity of the hub, wherein the FFC is wound around the center of the hub in a second direction opposite to the first direction, the FFC comprising a first end for electrically coupling to a female jack connector of a device; and
  a female connector electrically coupled to a second end of the FFC for engaging a male jack connector of the user-provided headphones,
  wherein when the reel rotates in the first direction, the winding of the spring tightens and the winding of the FFC loosens,
  wherein when the reel rotates in the second direction, the winding of the spring loosens and the winding of the FFC tightens;
a main body coupled to the reel assembly at a first side of the main body, the main body comprising a main body cavity at a second side of the main body for housing the device; and
a headphone switch assembly, comprising:
  a male jack connector electrically coupled to the first end of the FFC; and
  a sliding switch coupled to the male jack connector and movably coupled to the main body, wherein when the sliding switch is moved toward the reel assembly, the male jack connector is moved to connect to the female jack connector of the device.

3. The case of claim 2, wherein the supporting plate comprises an axel, the hub further comprises a first center hole, and the reel comprises a second center hole,
  wherein the axel of the supporting plate traverses the first center hole of the hub and the second center hole of the reel, wherein the axel couples to the reel in the second center hole of the reel.

4. The case of claim 2, wherein the reel comprises a center post, wherein the hub comprises an outer side wall, wherein the spring comprises a first end and a second end, wherein the first end of the spring couples to the center post of the reel, wherein the second end of the spring couples to the outer side wall of the hub.

5. The case of claim 2, wherein the female connector resides on a surface of the reel opposite to the hub,
  wherein when the reel rotates in the first direction, the female connector rotates in the first direction, wherein when the reel rotates in the second direction, the female connector rotates in the second direction.

6. The case of claim 2, wherein the reel further comprises a plurality of notches,
wherein the case further comprises a retractor switch assembly, comprising:
an arm,
a cavity proximate to the arm, and
a switch mechanism for moving the arm into or out of the cavity,
wherein when the arm moves into the cavity, the arm disengages from any of the plurality of notches,
wherein when arm moves out of cavity, the arm engage any of the plurality of notches.

7. The case of claim 2, further comprising a reel cover coupled to the reel at a side opposite to the hub.

8. The case of claim 2, further comprising:
a shell coupled to the main body, wherein the reel assembly resides between the main body and the shell; and
an end cap for coupling to the main body to hold the device within the main body cavity.

9. The case of claim 8, wherein the supporting plate of the reel assembly is integrated with the first side of the main body.

10. The case of claim 2, wherein the supporting plate comprises a plurality of pegs, wherein the hub further comprises a plurality of holes corresponding to the plurality of pegs and a first center hole,
wherein the plurality of pegs of the supporting plate residing within the plurality of holes of the hub prevents the hub from rotating when the reel rotates in the first direction or the second direction.

11. A mobile device case, comprising:
a reel assembly, comprising:
a reel for storing a cord of user-provided headphones;
a supporting plate coupled to the reel;
a hub coupled between the reel and the supporting plate, comprising: a first cavity between a first side of the hub and the supporting plate, and a second cavity between a second side of the hub and the reel;
a spring residing within the first cavity of the hub, wherein the spring is wound around a center of the hub in a first direction;
a flat flexible cable (FFC) residing within the second cavity of the hub, wherein the FFC is wound around the center of the hub in a second direction opposite to the first direction, the FFC comprising a first end for electrically coupling to a female jack connector of a device; and
a female connector electrically coupled to a second end of the FFC for engaging a male jack connector of the user-provided headphones,
wherein when the reel rotates in the first direction, the winding of the spring tightens and the winding of the FFC loosens,
wherein when the reel rotates in the second direction, the winding of the spring loosens and the winding of the FFC tightens;
a headphone switch assembly, comprising:
a male jack connector electrically coupled to the first end of the FFC; and
a switch mechanism for engaging and disengaging the male jack connector with the female jack connector of the device; and
a membrane, the membrane comprising a first surface and a second surface opposite to the first surface,
wherein the second end of the FFC is electrically coupled to the first surface of the membrane,
wherein the female connector is mounted and electrically coupled to the second surface of the membrane.

12. A mobile device case, comprising:
a reel assembly, comprising:
a reel for storing a cord of user-provided headphones;
a supporting plate coupled to the reel;
a hub coupled between the reel and the supporting plate, comprising: a first cavity between a first side of the hub and the supporting plate, and a second cavity between a second side of the hub and the reel;
a spring residing within the first cavity of the hub, wherein the spring is wound around a center of the hub in a first direction;
a flat flexible cable (FFC) residing within the second cavity of the hub, wherein the FFC is wound around the center of the hub in a second direction opposite to the first direction;
a female connector electrically coupled to a second end of the FFC for engaging a male jack connector of the user-provided headphones; and
a membrane comprising a first surface and a second surface opposite to the first surface, wherein a first end of the FFC is electrically coupled to the first surface of the membrane, wherein the female connector is electrically coupled to the second surface of the membrane,
wherein when the reel rotates in the first direction, the winding of the spring tightens and the winding of the FFC loosens,
wherein when the reel rotates in the second direction, the winding of the spring loosens and the winding of the FFC tightens.

13. The case of claim 12, wherein the supporting plate comprises a plurality of pegs, wherein the hub further comprises a plurality of holes corresponding to the plurality of pegs and a first center hole,
wherein the plurality of pegs of the supporting plate residing within the plurality of holes of the hub prevents the hub from rotating when the reel rotates in the first direction or the second direction.

14. The case of claim 12, further comprising:
a headphone switch assembly, comprising:
a male jack connector electrically coupled to the second end of the FFC; and
a switch mechanism for engaging and disengaging the male jack connector with the female jack connector of the device.

15. The case of claim 12, further comprising a main body coupled to the reel assembly at a first side of the main body, the main body comprising a main body cavity at a second side of the main body for housing the device, wherein the supporting recess of the reel assembly is integrated with the first side of the main body.

* * * * *